(12) United States Patent
Astley et al.

(10) Patent No.: US 9,970,970 B2
(45) Date of Patent: May 15, 2018

(54) APPARATUS, METHOD AND COMPUTER PROGRAM FOR SENSING

(71) Applicant: Nokia Technologies Oy, Espoo (FI)

(72) Inventors: Michael Robert Astley, Waterbeach (GB); Darryl Cotton, Cambs (GB); Jani Kivioja, Cambourne (GB); Richard White, Cambridgeshire (GB)

(73) Assignee: Nokia Technologies Oy, Espoo (FI)

( * ) Notice: Subject to any disclaimer, the term of this patent is extended or adjusted under 35 U.S.C. 154(b) by 764 days.

(21) Appl. No.: 14/510,041

(22) Filed: Oct. 8, 2014

(65) Prior Publication Data
US 2015/0142355 A1 May 21, 2015

(30) Foreign Application Priority Data

Oct. 28, 2013 (GB) .................................. 1318927.9

(51) Int. Cl.
| | |
|---|---|
| *G06F 19/00* | (2018.01) |
| *G01R 27/26* | (2006.01) |
| *G01D 5/16* | (2006.01) |
| *G01D 5/24* | (2006.01) |
| *G01R 27/02* | (2006.01) |

(52) U.S. Cl.
CPC .......... *G01R 27/2605* (2013.01); *G01D 5/16* (2013.01); *G01D 5/2405* (2013.01); *G01R 27/02* (2013.01)

(58) Field of Classification Search
CPC ...... G01D 5/24; A61M 16/00; A61M 16/0677
USPC .......................................... 702/65, 182–185
See application file for complete search history.

(56) References Cited

U.S. PATENT DOCUMENTS

| | | |
|---|---|---|
| 4,426,616 A | 1/1984 | Maier |
| 7,147,606 B1 | 12/2006 | Chang et al. |
| 7,279,647 B2 | 10/2007 | Philipp |
| 7,408,364 B1 | 8/2008 | Campbell |
| 8,412,477 B2 | 4/2013 | Krauss et al. |
| 2008/0127739 A1 | 6/2008 | DeAngelis et al. |
| 2009/0020343 A1 | 1/2009 | Rothkopf et al. |
| 2009/0273483 A1 | 11/2009 | Tompkins et al. |

(Continued)

FOREIGN PATENT DOCUMENTS

| | | |
|---|---|---|
| EP | 2546730 A2 | 1/2013 |
| WO | 2010/117664 A2 | 10/2010 |
| WO | 2013/029642 A1 | 3/2013 |

OTHER PUBLICATIONS

"Electronic Measurement Advantages of Capacitive Sensors", Need for Capacitive Load Cells, Retrieved on Dec. 15, 2014, Webpage available at : http://www.loadstarsensors.com/why-build-capacitive-load-cells.html.

(Continued)

*Primary Examiner* — Edward Raymond
(74) *Attorney, Agent, or Firm* — Harrington & Smith

(57) ABSTRACT

A method, apparatus and computer program wherein the method comprises: providing a first input signal to a sensor; measuring a first output signal provided from the sensor in response to the first input signal and calculating capacitance of the sensor from the first measured output signal; providing a second input signal to the sensor; measuring the output signal provided from the sensor in response to the second input signal and calculating resistance of the sensor from the second measured output signal; wherein the first and second input signals are provided at different times.

19 Claims, 9 Drawing Sheets

(56) References Cited

U.S. PATENT DOCUMENTS

| | | |
|---|---|---|
| 2010/0201635 A1 | 8/2010 | Klinghult et al. |
| 2010/0289508 A1 | 11/2010 | Joguet et al. |
| 2012/0293448 A1 | 11/2012 | Dietz et al. |
| 2013/0009905 A1 | 1/2013 | Castillo et al. |
| 2013/0068015 A1 | 3/2013 | Sinha et al. |
| 2013/0082936 A1* | 4/2013 | Islamkulov ............ H04N 5/378 345/173 |
| 2013/0082970 A1 | 4/2013 | Frey et al. |
| 2013/0257787 A1 | 10/2013 | White et al. |

OTHER PUBLICATIONS

Fraden, "Handbook of Modern Sensors", Physics, Designs, and Applications, 4th edition, 2010, pp. 663.

Zhao et al., "Humidity Sensing Properties of the Sensor Based on Graphene Oxide films with different Dispersion Concentrations", IEEE Sensors, Oct. 28-31, 2011, pp. 129-132.

Search Report received for corresponding United Kingdom Patent Application No. 1318927.9, dated Apr. 23, 2014, 4 pages.

\* cited by examiner

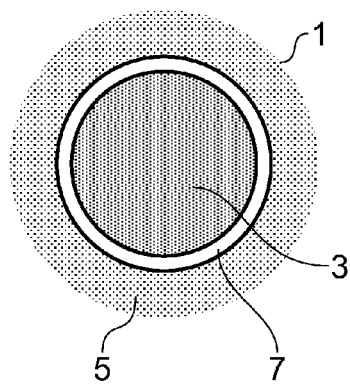
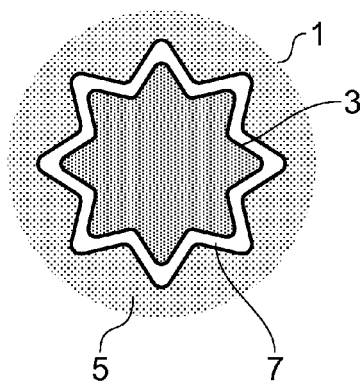
FIG. 1A　　　　FIG. 1B
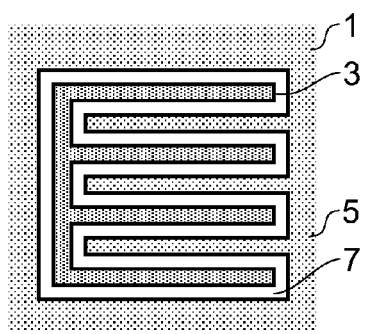
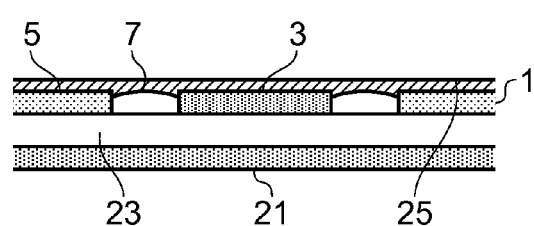
FIG. 1C　　　　FIG. 2
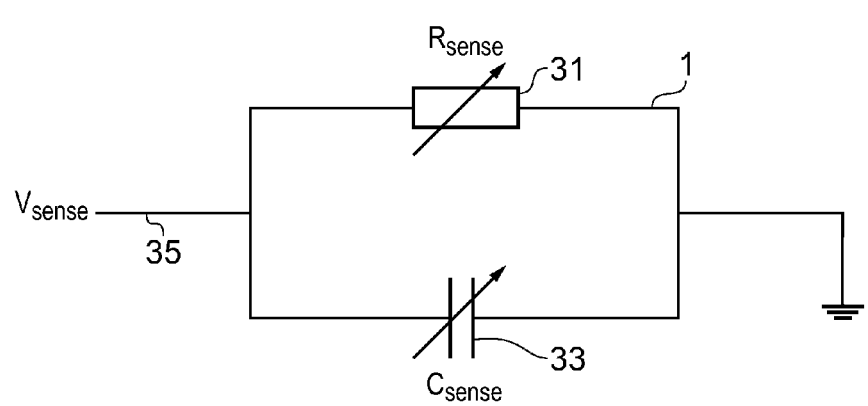
FIG. 3

APPARATUS, METHOD AND COMPUTER PROGRAM FOR SENSING

TECHNOLOGICAL FIELD

Examples of the present disclosure relate to an apparatus, method and computer program for sensing. In particular, they relate to an apparatus, method and computer program for sensing a plurality of different parameters.

BACKGROUND

Sensors which enable different parameters to be sensed are known. For example some parameters may be sensed by a variable capacitor arrangement while other parameters may be sensed by a variable resistance arrangement. It may be useful to integrate such sensors into a single apparatus to enable a single apparatus to detect more than one different parameter or user input.

BRIEF SUMMARY

According to various, but not necessarily all, examples of the disclosure there may be provided a method comprising: providing a first input signal to a sensor; measuring a first output signal provided from the sensor in response to the first input signal and calculating capacitance of the sensor from the first measured output signal; providing a second input signal to the sensor; measuring the output signal provided from the sensor in response to the second input signal and calculating resistance of the sensor from the second measured output signal; wherein the first and second input signals are provided at different times.

In some examples the first and second input signals may be provided a plurality of times.

In some examples the first and second input signals may be provided alternately.

In some examples the first input signal may comprise a first pulse sequence and the second input signal may comprise a second, different pulse sequence.

In some examples the first input signal may cause a capacitor within the sensor to be repeatedly charged and discharged.

In some examples the second input signal may cause a measurement capacitor to be charged and then discharged through the sensor.

In some examples the method may further comprise storing the calculated capacitance and resistance.

In some examples the sensor may be configured to provide a variable capacitance that varies in response to a first sensed parameter and a variable resistance that varies in response to a second sensed parameter. In some examples the first sensed parameter may comprises a conductive object in proximity to the sensor. In some examples the second sensed parameter may comprise an environmental parameter.

According to various, but not necessarily all, examples of the disclosure there may be provided an apparatus comprising: processing circuitry; and memory circuitry including computer program code; the memory circuitry and the computer program code configured to, with the processing circuitry, cause the apparatus at least to perform: providing a first input signal to a sensor; measuring a first output signal provided from the sensor in response to the first input signal and calculating capacitance of the sensor from the first measured output signal; providing a second input signal to the sensor; measuring the output signal provided from the sensor in response to the second input signal and calculating resistance of the sensor from the second measured output signal; wherein the first and second input signals are provided at different times.

In some examples the memory circuitry and the computer program code may be configured to, with the processing circuitry, cause the first and second input signals to be provided a plurality of times.

In some examples the memory circuitry and the computer program code may be configured to, with the processing circuitry, cause the first and second input signals to be provided alternately.

In some examples the first input signal may comprise a first pulse sequence and the second input signal may comprise a second, different pulse sequence.

In some examples the first input signal may cause a capacitor within the sensor to be repeatedly charged and discharged.

In some examples the second input signal may cause a measurement capacitor to be charged and then discharged through the sensor.

In some examples the memory circuitry and the computer program code may be configured to, with the processing circuitry, cause the calculated capacitance and resistance to be stored.

In some examples the sensor may be configured to provide a variable capacitance that varies in response to a first sensed parameter and a variable resistance that varies in response to a second sensed parameter. In some examples the first sensed parameter may comprise a conductive object in proximity to the sensor. In some examples the second sensed parameter may comprise an environmental parameter.

According to various, but not necessarily all, examples of the disclosure there may be provided a computer program comprising computer program instructions that, when executed by processing circuitry, enable: providing a first input signal to a sensor; measuring a first output signal provided from the sensor in response to the first input signal and calculating capacitance of the sensor from the first measured output signal; providing a second input signal to the sensor; measuring the output signal provided from the sensor in response to the second input signal and calculating resistance of the sensor from the second measured output signal; wherein the first and second input signals are provided at different times.

In some examples there may be provided a computer program comprising program instructions for causing a computer to perform the methods described above.

In some examples there may be provided a physical entity embodying the computer program as described above.

In some examples there may be provided an electromagnetic carrier signal carrying the computer program as described above.

According to various, but not necessarily all, examples of the disclosure there may be provided an apparatus comprising: a sensor configured to have a variable capacitance that varies in response to a first sensed parameter and a variable resistance that varies in response to a second sensed parameter; input circuitry configured to provide a first input signal and a second input signal wherein the first input signal and the second input signal are provided to the sensor at different times; and output circuitry configured to measure the output signals provided by the sensor in response to the input signals.

In some examples the first sensed parameter may comprise a conductive object in proximity to the sensor.

In some examples the second sensed parameter may comprise an environmental parameter.

In some examples the first input signal may enable the capacitance of the sensor to be measured.

In some examples the second input signal may enable the resistance of the sensor to be measured.

In some examples the sensor may comprise a first electrode and a second electrode wherein a material having a variable resistance is provided between the first and second electrode.

In some examples the material having variable resistance is provided around a circumference of the first electrode.

The apparatus may be for sensing. The apparatus may be for sensing user inputs and/or environmental parameters.

BRIEF DESCRIPTION

For a better understanding of various examples that are useful for understanding the detailed description, reference will now be made by way of example only to the accompanying drawings in which:

FIGS. 1A to 1C illustrate sensors;

FIG. 2 illustrates a cross section through an example sensor;

Figure 4:
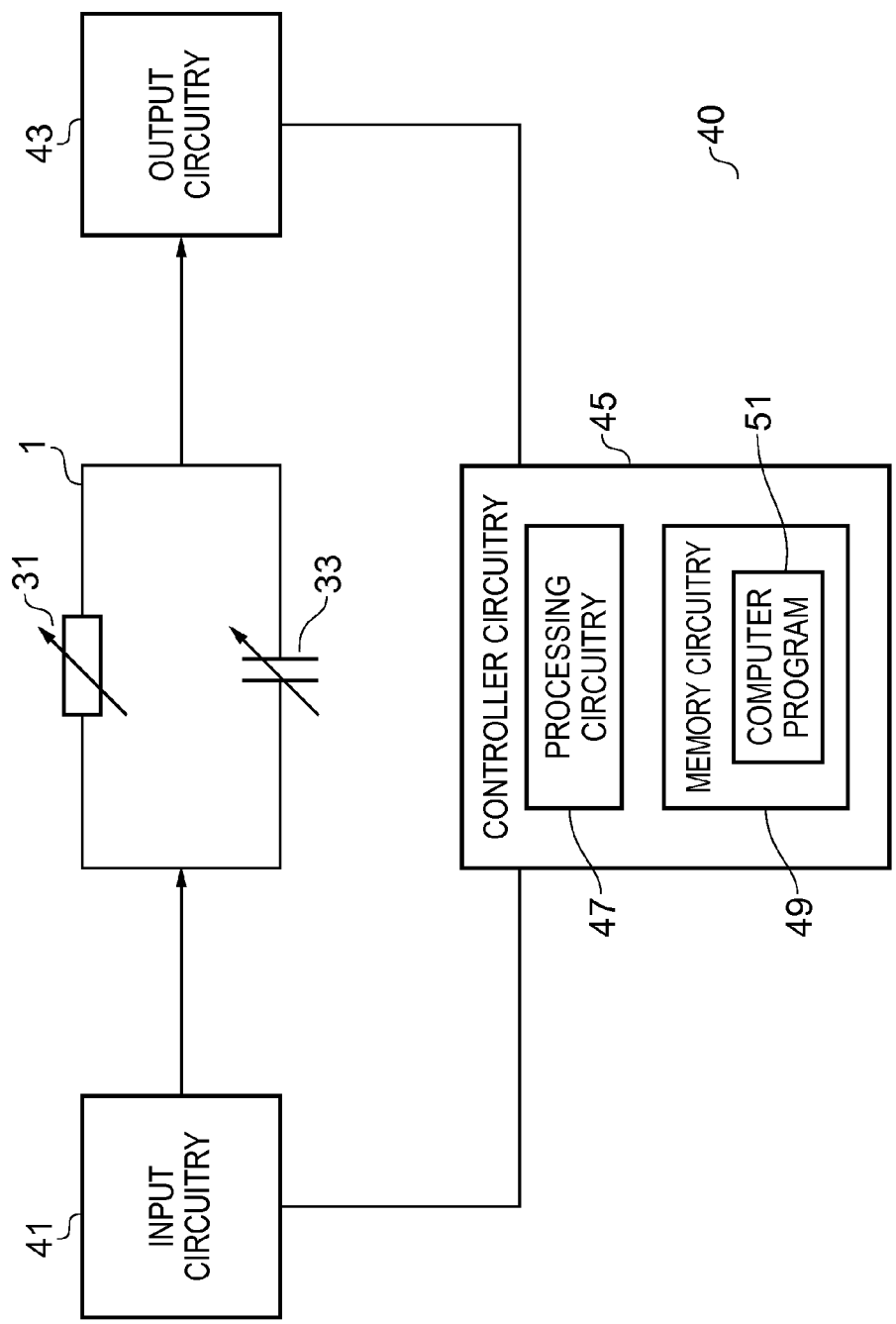
Figure 5:
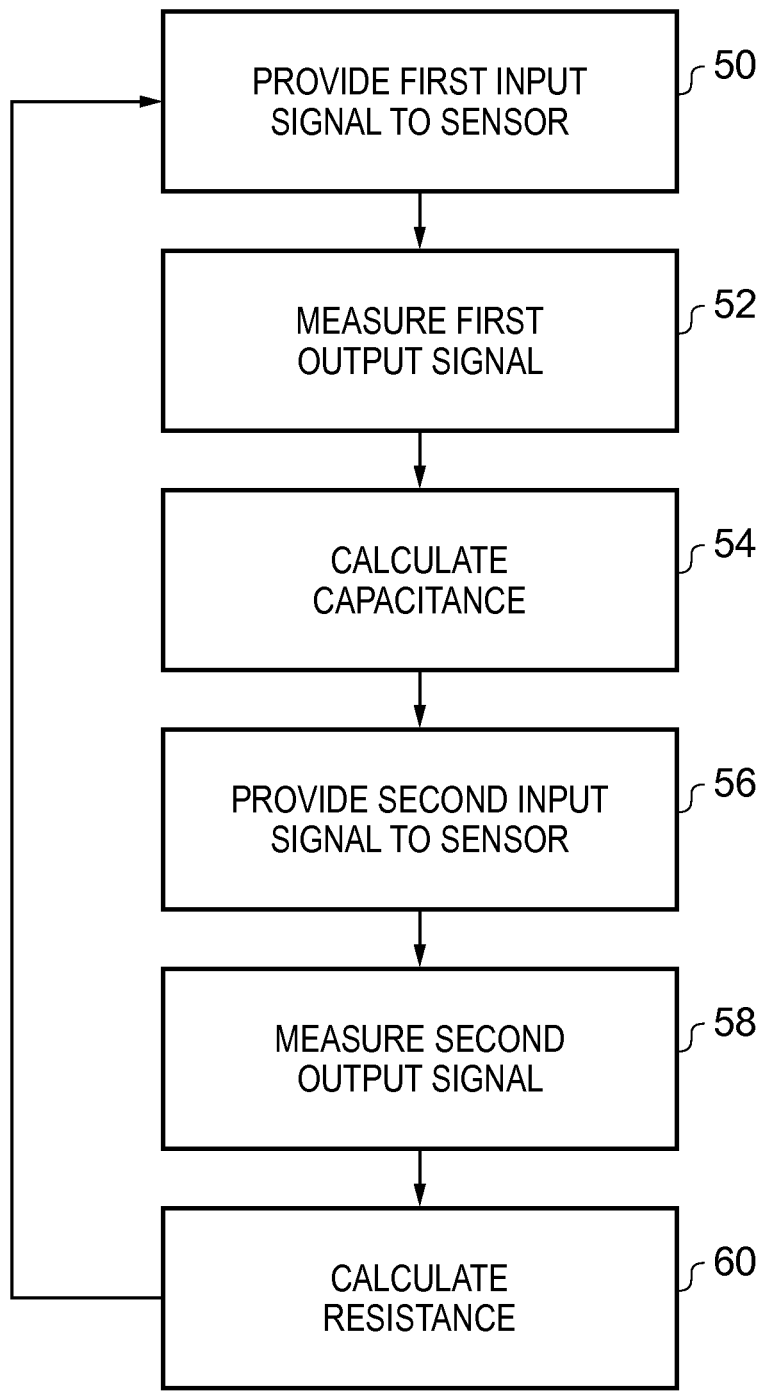
Figure 6:
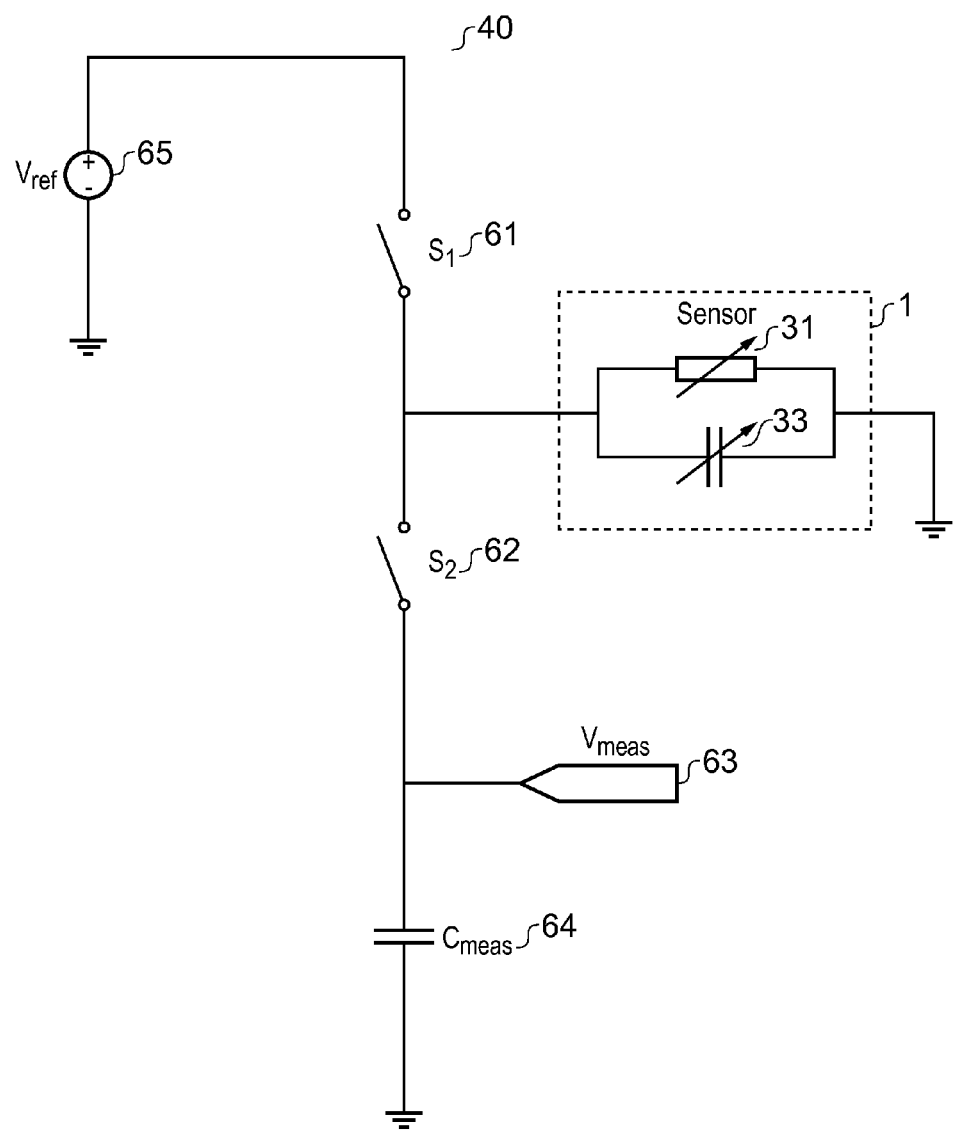
Figure 7:
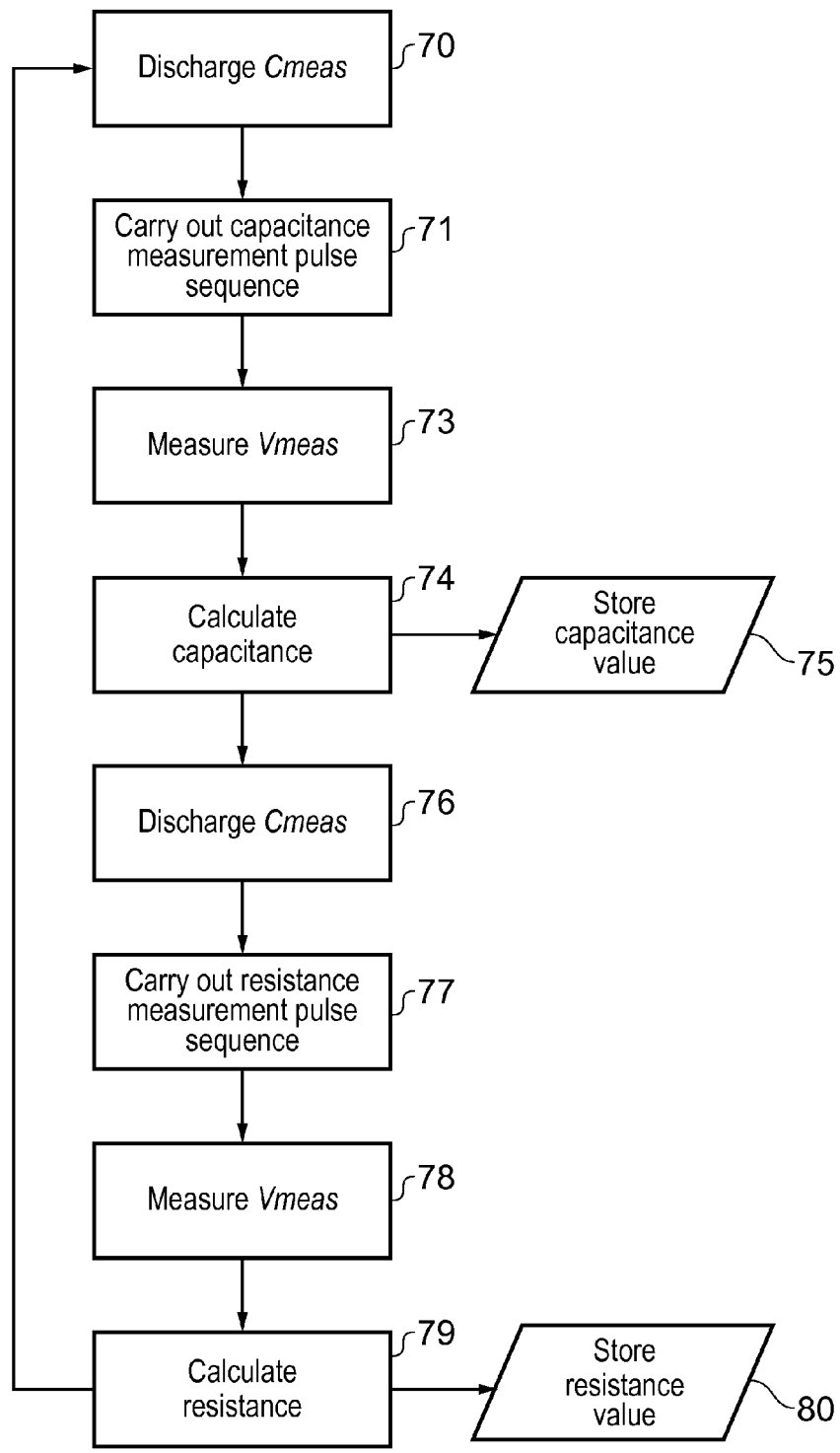
Figure 8A:
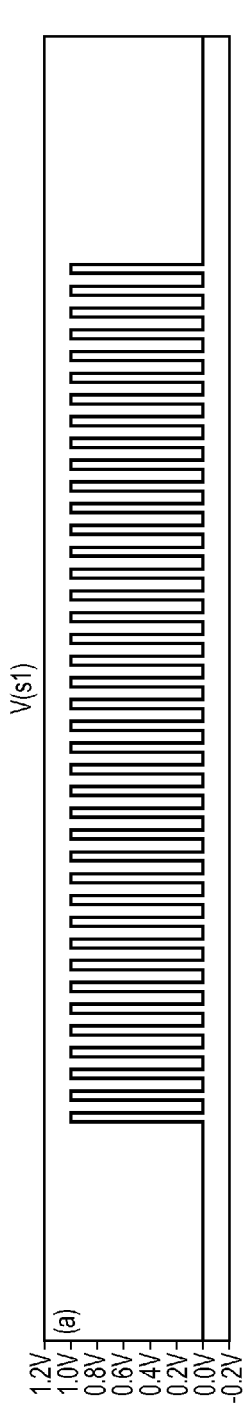
Figure 8B:
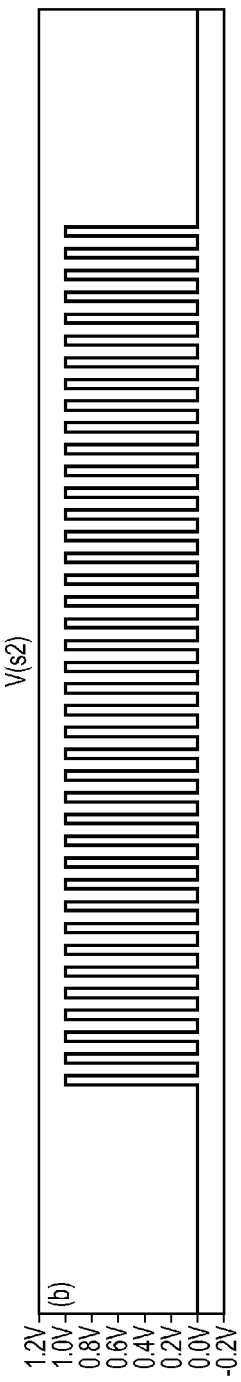
Figure 8C:
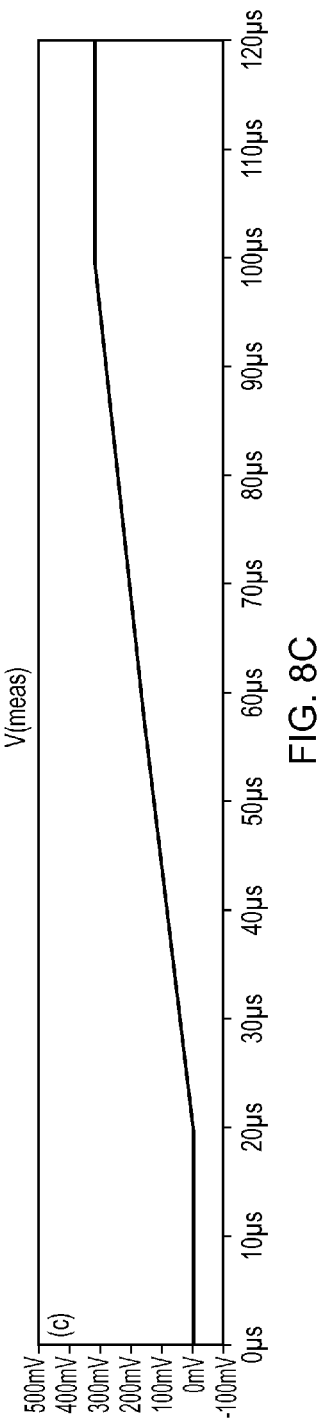
Figure 9A:
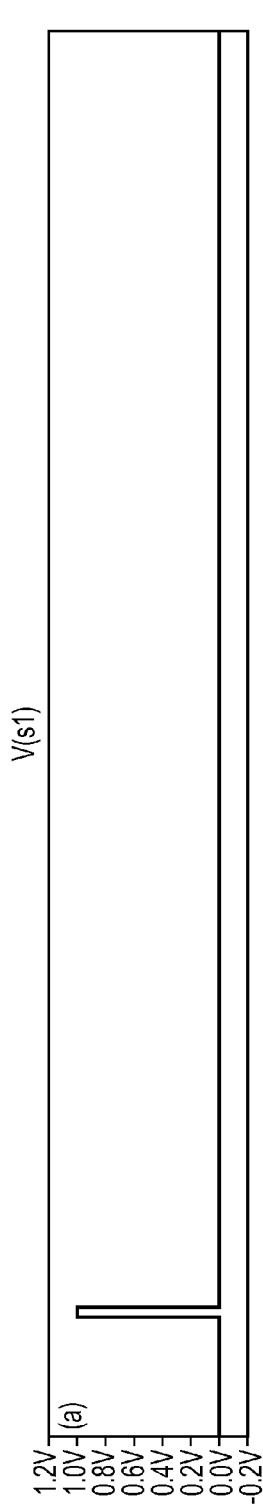
Figure 9B:
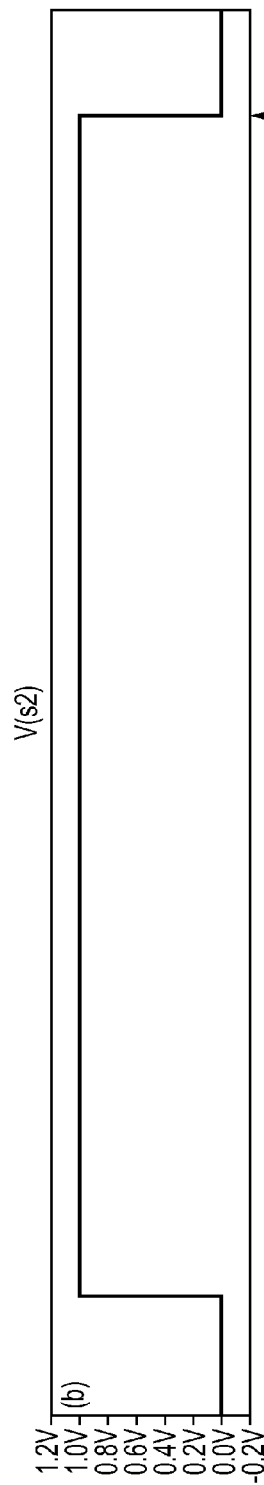
Figure 9C:
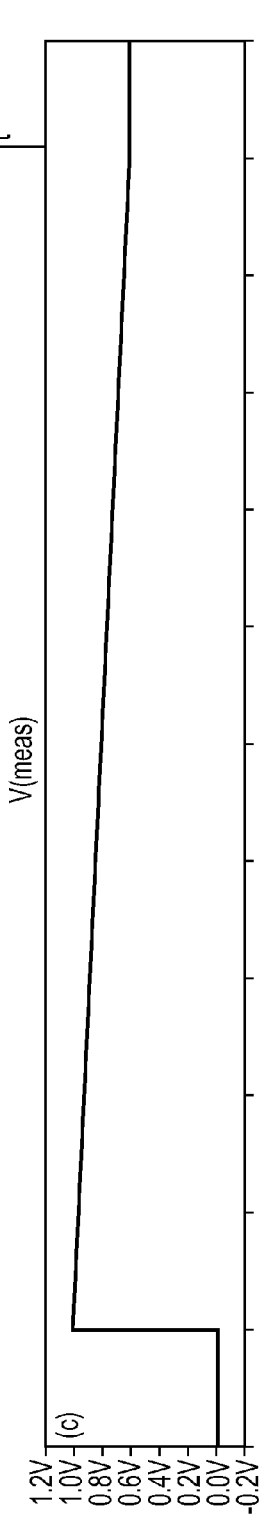

FIG. 3 schematically illustrates an example sensor;

FIG. 4 schematically illustrates an example apparatus;

FIG. 5 illustrates a method;

FIG. 6 schematically illustrates another example apparatus;

FIG. 7 illustrates a method;

FIGS. 8A to 8C illustrate pulse sequences;

FIGS. 9A to 9C illustrate pulse sequences; and

FIGS. 10A to 10D illustrate plots of an output voltage.

DETAILED DESCRIPTION

The Figures illustrate a method comprising: providing a first input signal to a sensor 1; measuring a first output signal provided from the sensor 1 in response to the first input signal and calculating capacitance of the sensor 1 from the first measured output signal; providing a second input signal to the sensor 1; measuring the output signal provided from the sensor 1 in response to the second input signal and calculating resistance of the sensor 1 from the second measured output signal; wherein the first and second input signals are provided at different times.

The Figures also illustrate an apparatus 40 comprising: a sensor 1 configured to have a variable capacitance 33 that varies in response to a first sensed parameter and a variable resistance 31 that varies in response to a second sensed parameter; input circuitry 41 configured to provide a first input signal and a second input signal wherein the first input signal and the second input signal are provided to the sensor at different times; and output circuitry 43 configured to measure the output signals provided by the sensor 1 in response to the input signals.

FIGS. 1A to 1C illustrate example sensors 1 which may be used in some examples of the disclosure. The sensors 1 may be configured to have a variable capacitance that varies in response to a first sensed parameter and a variable resistance that varies in response to a second sensed parameter.

The example sensors 1 of FIGS. 1A to 1C comprise a first electrode 3 and a second electrode 5. A resistive material 7 is provided between the first electrode 3 and the second electrode 5.

In the examples of FIGS. 1A to 1C the first electrode 3 may be provided in the middle of the sensor. The first electrode 3 may be provided in the middle of the sensor 1 so that the resistive material 7 and the second electrode 5 completely surround the first electrode 3. The first electrode 3 may comprise any suitable conductive material.

The resistive material 7 is provided around the circumference of the first electrode 3. In some examples the resistive material 7 may extend around the entire of the circumference of the first electrode 3. The resistive material 7 may be provided as a thin film.

The resistive material 7 may comprise a material which has a variable resistance. The resistive material 7 may have a resistance which varies in dependence on the presence of a parameter which is sensed by the resistive material 7. The sensed parameter may comprise an environmental parameter such as a chemical which may be present in the environment around the sensor 1 or any other physical parameter which may be detected such as temperature or light.

The resistive material 7 may have a resistive transduction mechanism so that the resistivity of the resistive material 7 changes in response to the parameter to be sensed. The material which is to be used may be determined by the parameter which is to be sensed.

In some examples the resistive material 7 may be used to enable the sensor 1 to detect humidity. In such examples the resistive material may comprise a material such as graphene oxide. The graphene oxide may be provided as a thin film.

In some examples the resistive material 7 may be configured to enable the sensor 1 to detect applied pressure. In such examples the conductive material 7 may comprise a piezoresistive material such as a quantum tunnelling composite. The quantum tunnelling composite may enable the sensor to be used to distinguish between a conductive stylus such as a finger and a non-conductive stylus. A finger or other conductive stylus would generate a response from both the pressure and the capacitive sensor whereas the non-conductive stylus would only generate a response in the pressure sensor. This may also enable the sensor to be used to detect further information about the touch such as how hard the user is pressing.

In some examples the resistive material 7 may be configured to enable the sensor 1 to detect applied strain. In such examples the conductive material 7 may comprise encapsulated graphite or any other suitable materials. In such examples the sensor 1 may be flexible. The sensor 1 may be configured to be used to detect when an object changes in shape. Such sensors 1 could be applied to objects such as smart clothing.

In some examples the resistive material may comprise a photoresitive material which may enable the sensor 1 to be used to detect the ambient light.

In the examples of FIGS. 1A to 1C the second electrode 5 is provided around the circumference of the resistive material 7. In some examples the second electrode 5 may extend around the entire of the circumference of the resistive material 7. The second electrode 5 may completely surround the first electrode 3 and the resistive material 7.

The first and second electrodes 3, 5 may be configured to provide a capacitive sensor arrangement. The electrodes 3, 5 may be configured to provide a touch sensor arrangement. The electrodes 3, 5 may be configured to provide a variable capacitance which varies in dependence of the proximity and location of conductive objects in relation to the sensor 1.

The electrodes 3, 5 may have any suitable shape. In the example of FIG. 1A the first electrode 3, has a circular shape and the resistive material 7 is provided as an annulus around the circular first electrode 3. The resistive material 7 may have the same thickness around the entire circumference of the first electrode 3. The second electrode 5 may be provided in any suitable shape. The first electrode 3 and the resistive material 7 may be provided in a circular gap within the second electrode 5.

In the example of FIG. 1B the first electrode 3 has a crenulated circumference so that a plurality of projections are provided around the edge of the first electrode 3. The resistive material 7 and the gap within the second electrode 5 also have corresponding crenulated shapes.

The crenulated circumference may increase the area covered by the resistive material 7 compared to a circular sensor of a similar size. This may decrease the resistance provided by the resistive material 7. This may make it easier to sense changes in resistivity of the sensor 1 due to the sensed parameter.

In the example of FIG. 1C the first electrode 3 has an interdigitated shape. The resistive material 7 and the gap within the second electrode 5 also have corresponding interdigitated shapes.

The interdigitated shape may increase the area covered by the resistive material 7 compared to a circular sensor or even a crenulated sensor of a similar size. This may decrease the resistance provided by the resistive material 7 which may make it easier to sense changes in resistivity of the sensor 1 due to the sensed parameter. However the interdigitated shape may make it harder to detect changes in the capacitance of the electrodes 3, 5.

It is to be appreciated that other shapes of electrodes 3, 5 and sensors 1 may be used in other examples of the disclosure.

Multiple sensors 1 may be arranged within a single apparatus to provide an array of sensors 1.

FIG. 2 illustrates a cross section through an example sensor 1. The example sensor may be a sensor 1 as illustrated in any of FIGS. 1A to 1C and as described above. The sensor 1 comprises a first electrode 3 which is provided in the centre of the sensor 1 and a second electrode 5 which is provided surrounding the first electrode 3. A layer of resistive material 7 is provided between the first and second electrodes 3, 5 as described above.

The sensor 1 is mounted on a substrate 21. In the example illustrated in FIG. 2 the substrate 21 is flat. It is to be appreciated that other shaped substrates 21 could be used in other examples, for example the substrate 21 may be curved.

In some examples the substrate 21 may be flexible or stretchable. The substrate 21 may be flexible or stretchable so that the apparatus 1 may be bent or deformed in response to a force applied by a user of the sensor 1. This may enable the sensor 1 to be used to detect strain and/or changes in shape of an apparatus. In other examples the substrate 21 may be rigid.

The substrate 21 may be made of a conductive or semiconductive material. In such examples the conductive or semiconductive material may be coated with an insulating material 23 in order to not short the electrodes 3, 5.

A cover layer 25 is provided overlaying the sensor 1. The cover 25 may be thin and have dielectric properties which enable a change in electric field to be detected by the capacitance sensor 1.

The material which is used for the cover 25 may depend on the parameter or parameters which are to be sensed by the sensor 1. The cover 25 may be permeable to the parameter which is to be sensed but impermeable to other parameters. For example if the sensor 1 is to be used to measure humidity then the cover 25 may be permeable to water but impermeable to other chemicals.

In examples where the sensor 1 may be used to detect pressure or strain the cover 25 may also be flexible. The material which is used for the cover may have a modulus which allows the cover 25 to bend and/or stretch as the sensor 1 is bent and/or stretched.

FIG. 3 schematically illustrates an example sensor 1 as illustrated in FIGS. 1A to 1C and FIG. 2. The sensor 1 may be represented as a variable resistor 31 in parallel with a variable capacitor 33. An input signal 35 may be provided to the sensor 1 to enable the variable resistance and the variable capacitance to be measured. In examples of the disclosure a first input signal may be provided at a first time and a second input signal may be provided at a second time. The first input signal may enable the capacitance of the sensor 1 to be measured and the second input signal may enable the resistance of the sensor 1 to be measured.

FIG. 4 schematically illustrates an apparatus 40 according to examples of the disclosure. The example apparatus 40 comprises a sensor 1, input circuitry 41, output circuitry 43 and controller circuitry 45.

The sensor 1 may be as described above in relation to FIGS. 1A to 1C, 2 and 3. The sensor 1 may be represented as a variable resistance 31 in parallel with a variable capacitance 33.

The input circuitry 41 may comprise any means which may be configured to provide an input signal 35 to the sensor 1. The input circuitry may be configured to provide a first input signal and a second input signal wherein the first input signal and the second input signal are provided to the sensor 1 at different times. The first input signal may enable the capacitance of the sensor 1 to be measured. The second input signal may enable the resistance of the sensor to be measured. The two input signals may be provided alternately. The two input signals may be provided a plurality of times.

The output circuitry 43 may comprise any means which may be configured to measure the output signals provided by the sensor 1 in response to the input signals. The output circuitry 43 may be configured to measure a first output signal which is provided in response to a first input signal. The output circuitry 43 may also be configured to measure a second output signal provided in response to a second input signal. The first input signal and the second input signal may be provided to the sensor 1 at different times. The first output signal may provide a measurement of the capacitance of the sensor 1. The second output signal may provide a measurement of the resistance of the sensor 1.

The input circuitry 41 and the output circuitry 43 may be controlled by the controller circuitry 45. The controller circuitry 45 may be implemented using instructions that enable hardware functionality, for example, by using executable computer program instructions in general-purpose or special-purpose processing circuitry 47 that may be stored on a computer readable storage medium (disk, memory etc) to be executed by such processing circuitry 47.

The processing circuitry 47 is configured to read from and write to the memory circuitry 49. The processing circuitry 47 may also comprise an output interface via which data and/or commands are output by the processing circuitry 47 and an input interface via which data and/or commands are input to the processing circuitry 47.

The memory circuitry 49 stores a computer program 51 comprising computer program instructions (computer program code) that controls the operation of the apparatus 40 when loaded into the processing circuitry 47. The computer program instructions, of the computer program 51, provide the logic and routines that enables the apparatus 40 to perform the methods illustrated in FIGS. 5 and 7. The processing circuitry 47 by reading the memory circuitry 49 is able to load and execute the computer program 51.

The apparatus 40 therefore comprises: processing circuitry 47; and memory circuitry 49 including computer program code; the memory circuitry 49 and the computer program code configured to, with the processing circuitry 47, cause the apparatus 40 at least to perform: providing a first input signal to a sensor 1; measuring a first output signal provided from the sensor 1 in response to the first input signal and calculating capacitance of the sensor 1 from the first measured output signal; providing a second input signal to the sensor 1; measuring the output signal provided from the sensor 1 in response to the second input signal and calculating resistance of the sensor 1 from the second measured output signal; wherein the first and second input signals are provided at different times.

The computer program 51 may arrive at the apparatus 40 via any suitable delivery mechanism. The delivery mechanism may be, for example, a non-transitory computer-readable storage medium, a computer program product, a memory device, a record medium such as a compact disc read-only memory (CD-ROM) or digital versatile disc (DVD), an article of manufacture that tangibly embodies the computer program 51. The delivery mechanism may be a signal configured to reliably transfer the computer program 51. The apparatus 40 may propagate or transmit the computer program 51 as a computer data signal.

Although the memory circuitry 49 is illustrated as a single component it may be implemented as one or more separate components some or all of which may be integrated/removable and/or may provide permanent/semi-permanent/dynamic/cached storage.

Although the processing circuitry 47 is illustrated as a single component it may be implemented as one or more separate components some or all of which may be integrated/removable.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used in this application, the term 'circuitry' refers to all of the following:
  (a) hardware-only circuit implementations (such as implementations in only analog and/or digital circuitry);
  (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions); and
  (c) to circuits, such as a microprocessor(s) or a portion of a microprocessor(s), that require software or firmware for operation, even if the software or firmware is not physically present.

This definition of "circuitry" applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

FIG. 5 illustrates a method for obtaining measurements from a sensor 1 according to an example of the disclosure. The sensor 1 may be a sensor 1 as described above in relation to FIGS. 1A to 1C and 2 to 4. In some examples the method may be implemented using controller circuitry as illustrated in FIG. 4. The example method may be used to obtain a measurement of the capacitance of the sensor 1 and a measurement of the resistance of the sensor 1.

At block 50 the method comprises providing a first input signal to a sensor 1. The first input signal may comprise a first pulse sequence. The first input signal may cause a capacitor within the sensor 1 to be repeatedly charged and discharged.

At block 52 the method comprises measuring a first output signal provided from the sensor 1 in response to the first input signal. At block 54 the method comprises calculating the capacitance of the sensor 1 from the first measured output signal. The calculated capacitance may be stored. The calculated capacitance may be stored in the memory circuitry 49 of the apparatus 40.

At block 56 the method comprises providing a second input signal to the sensor 1. The second input signal may be provided at a different time to the first input signal. The second input signal may comprise a second pulse sequence. The pulse sequence of the second input signal may be different to the pulse sequence of the first input signal. The second input signal may enable a measurement capacitor to be charged and then discharged through the sensor 1.

At block 58 the method comprises measuring the output signal provided from the sensor 1 in response to the second input signal. At block 60 the method comprises calculating the resistance of the sensor 1 from the second measured output signal. The calculated resistance may be stored. The calculated resistance may be stored in the memory circuitry 49 of the apparatus 40.

Once the resistance has been calculated the method may return to block 50 so that the first input signal may be provided again. The method may be repeated so that the first input signal and the second input signal are provided a plurality of times. In some examples the method may be repeated continuously so that there is as small a time gap as possible between the provision of the input signals.

FIG. 6 schematically illustrates another example apparatus 40 according to an example of the disclosure. The apparatus 40 comprises a sensor 1 which comprises a variable resistance 31 in parallel with a variable capacitance 33. The sensor 1 is connected to ground. The sensor 1 may be directly connected to ground.

The apparatus 40 also comprises a first switch 61. The first switch 61 is provided between a source 65 and the sensor 1. The source 65 may be configured to provide the input signal 35 to the sensor 1. A second switch 62 is provided between the sensor 1 and a measurement capacitor 64.

The switches 61, 62 may comprise any suitable switching means. For example the switches 61, 62 may be digitally controlled analogue switches. In some examples the switches could be created using tri-state, open-source or open drain outputs which may be configured to switch between a reference level and a high impedance state.

The measurement capacitor 64 may be connected to ground. The measurement capacitor 64 may have a significantly higher capacitance then the variable capacitor of the sensor 1. For example the measurement capacitor 64 may have capacitance which may be of the order of ten times higher than the variable capacitor of the sensor 1. As an example the variable capacitor of the sensor 1 may have a capacitance in the range of 2 to 40 pF while the measurement capacitor 64 may have a capacitance of approximately 200 to 4000 pF. It is to be appreciated that these ranges are examples and that other ranges may be used.

The output signal may be measured by between the second switch 62 and the measurement capacitor 64. The output signal may be measured using any suitable means 63 such as an analogue to digital converter or by allowing the measurement capacitor 64 to discharge through a known resistance and measuring the time it takes for the voltage to cross a threshold.

FIG. 7 illustrates a method of measuring the capacitance and the resistance of the sensor 1 using the apparatus of FIG. 6.

At block 70 the measurement capacitor 64 is discharged. At block 71 a first input signal is provided. In this example the first input signal comprises a pulse input sequence which enables the capacitance of the sensor 1 to be measured.

An example of a pulse input sequence which may be used to measure capacitance is illustrated in FIGS. 8A and 8B. FIG. 8A represents the control of the first switch 61 and FIG. 8B represents the control of the second switch 62. The first switch 61 and the second switch 62 are opened and closed alternately. During the first pulse input sequence, whenever the first switch 61 is open the second switch 62 is closed. Similarly whenever the first switch 61 is closed the second switch 62 is open.

When the first switch 61 is closed a charge is stored by the capacitive sensor 1. The charge Q may be given by $Q = V_{ref} C_{sense}$ where $V_{ref}$ is the voltage of the input signal and $C_{sense}$ is the value of the capacitor of the sensor 1.

The capacitance of the measuring capacitor 64 $C_{meas}$ may be much larger than the capacitance of the sensor 1 so that when the second switch 62 is closed the charge flows from the sensor 1 to the measuring capacitor 64. This increases the charge stored on the measuring capacitor 64. This causes an increase in the output voltage $V_{meas}$. If the output voltage remains much smaller than the input voltage then the increase in the voltage may be given by $$\Delta V_{meas} \approx V_{ref} \frac{C_{sense}}{C_{meas}}.$$

After N cycles of opening and closing the switches 61, 62 $V_{meas}$ is given by $$V_{meas} \approx N V_{ref} \frac{C_{sense}}{C_{meas}}.$$

FIG. 8C represents the potential stored on the measurement capacitor 64.

The resistance of the sensor 1 will have the effect that it will discharge the measurement capacitor 64 when the second switch 62 is closed. However this effect will be negligible if the time constant $R_{sense} C_{meas}$ is much greater than the time for which the second switch 62 is left open.

At block 73 the voltage of the output signal $V_{meas}$ is measured. This may be measured using any suitable technique such as using an analogue to digital converter or by allowing the measurement capacitor 64 to discharge through a known resistance and measuring the time it takes for the voltage to cross a threshold.

At block 74 the value of the capacitance of the sensor 1 $C_{sense}$ is calculated from the measured voltage. The calculated value of $C_{sense}$ may then be stored in memory circuitry at block 75.

Once the first input pulse signal has been completed and the voltage of the output signal $V_{meas}$ has been measured the method moves to block 76 and discharges the measurement capacitor 64. At block 77 a second input signal is provided. In this example the second input signal comprises a pulse input sequence which enables the resistance of the sensor 1 to be measured.

An example of a pulse input sequence which may be used to measure resistance is illustrated in FIGS. 9A and 9B. FIG. 9A represents the control of the first switch 61 and FIG. 9B represents the control of the second switch 62. In the example pulse sequence of FIGS. 9A and 9B both the first switch 61 and the second switch 62 are closed initially. The first switch 61 is then opened and the second switch 62 remains closed. The second switch 62 is then opened after a time t.

When the first switch 61 and the second switch 62 are closed this allows the measurement capacitor 64 to be charged. When the first switch 61 is opened this allows the charge on the measurement capacitor 64 to dissipate through the resistance of the sensor 1. FIG. 9C represents the charge stored on the measurement capacitor 64.

At time t the second switch 62 is opened. The remaining charge left on the measurement capacitor 64 is produces a voltage $$V_{meas} = V_{ref} e^{-\frac{t}{R_{sense} C_{meas}}}.$$

At block 78 the voltage of the output signal $V_{meas}$ is measured. As mentioned above the voltage may be measured using any suitable technique such as using an analogue to digital converter or by allowing the measurement capacitor 64 to discharge through a known resistance and measuring the time it takes for the voltage to cross a threshold.

At block 79 the value of the resistance of the sensor 1 $R_{sense}$ is calculated from the measured voltage. The calculated value of $R_{sense}$ may then be stored in memory circuitry at block 80.

Once the second input pulse signal has been completed and the voltage of the output signal $V_{meas}$ has been measured the method may return to block 70 and the measurement capacitor 64 may be discharged again so that the method may be repeated.

In the examples of FIGS. 6 and 7 the same measurement capacitor 64 may be used for measuring both the resistance and the capacitance of the sensor 1. This may provide a simple apparatus 40. In other examples different measurement capacitors could be used when measuring resistance and capacitance. This may be useful if $R_{sense}$ has a large value as this may increase the time it takes to discharge the measurement capacitor 64.

A switch may be provided to switch between the measurement capacitors as necessary. For example, two measurement capacitors could be provided in parallel. A switch may be configured to enable one or both of the capacitors to be used depending on whether resistance or capacitance of the sensor 1 is being measured.

Figure 10A:
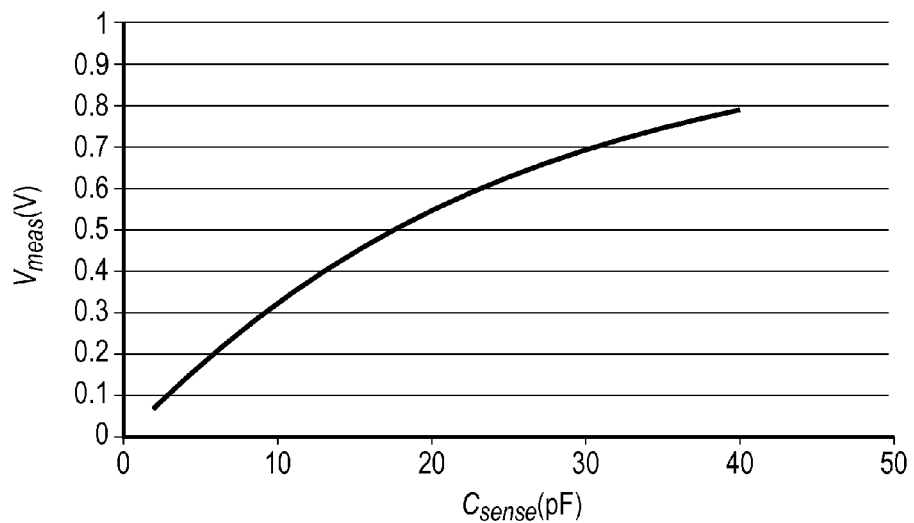
Figure 10B:
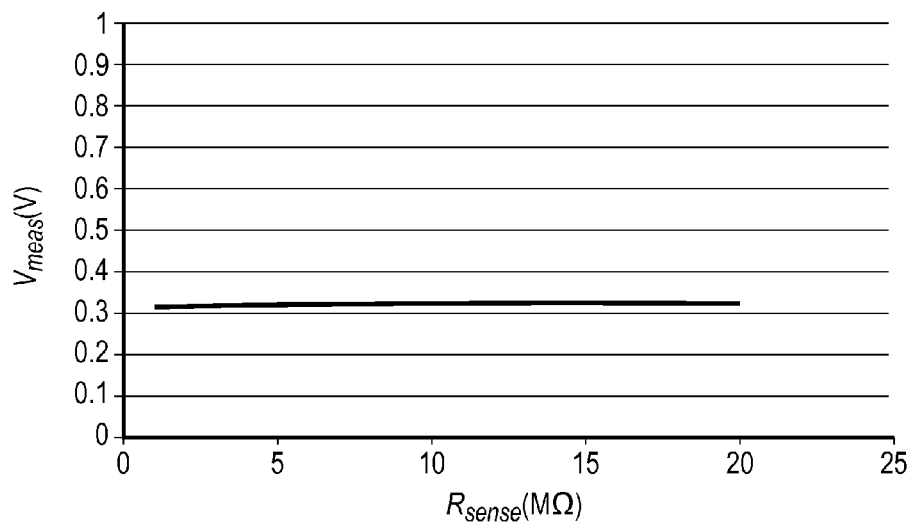

FIGS. 10A to 10D are plots illustrate the dependence of $V_{meas}$ on the values of $C_{sense}$ and $R_{sense}$. FIG. 10A illustrates the dependence of $V_{meas}$ on $C_{sense}$ while the first input sequence is being used and FIG. 10B illustrates the dependence of $V_{meas}$ on $R_{sense}$ while the first input sequence is being used. It can be seen that the value of $V_{meas}$ is independent or approximately independent of the value of $R_{sense}$. Therefore the first pulse sequence provides a reliable method of measuring $C_{sense}$.

Figure 10C:
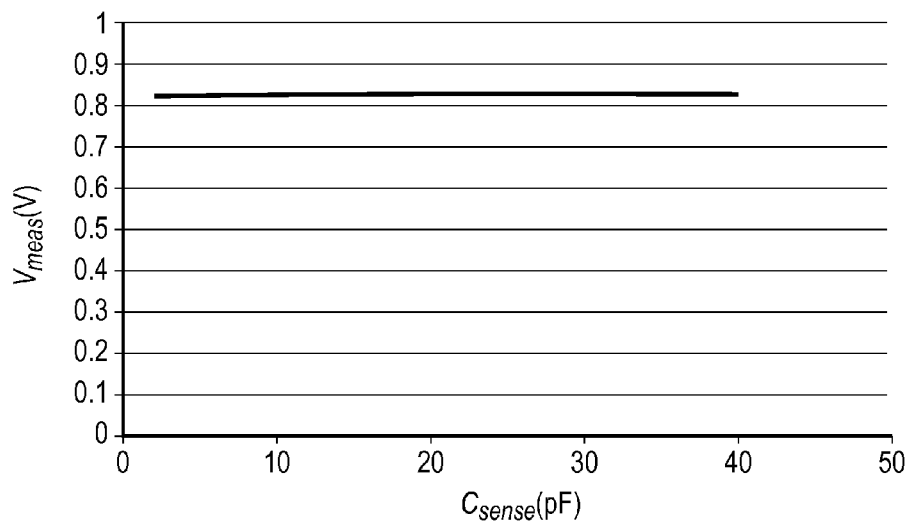
Figure 10D:
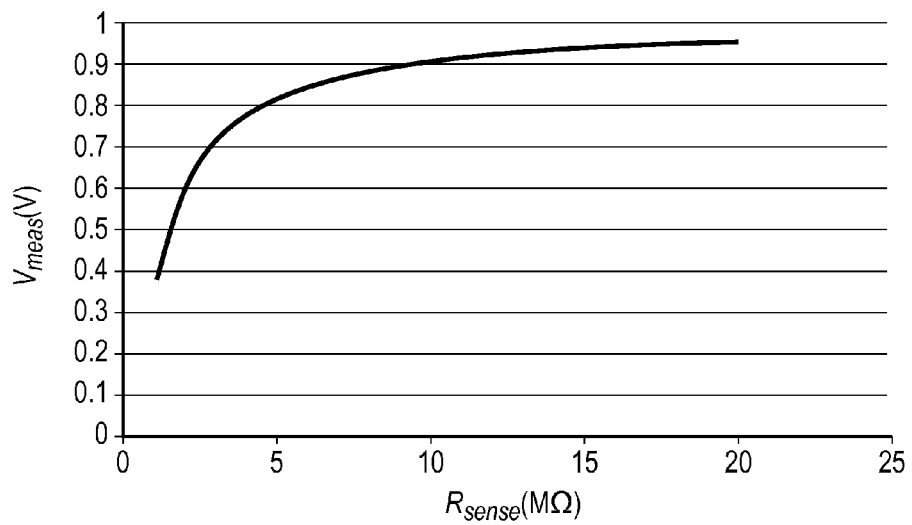

FIG. 10C illustrates the dependence of $V_{meas}$ on $C_{sense}$ while the second input sequence is being used and FIG. 10D illustrates the dependence of $V_{meas}$ on $R_{sense}$ while the second input sequence is being used. It can be seen that the value of $V_{meas}$ is independent or approximately independent of the value of $C_{sense}$. Therefore the second pulse sequence provides a reliable method of measuring $R_{sense}$.

Examples of the disclosure provide an apparatus and method for measuring the resistance and capacitance of a sensor 1. By providing two different pulse sequences at two different times the resistance and the capacitance can be decoupled so that they can be measured independently.

The method described above may be implemented using simple electronics and without the need for complicated algorithms or phase calculations. This may make the apparatus simpler and more cost effective.

The sensor 1 may be used to sense two different parameters. This may allow for a wider range of user inputs to be detected. For example, where the resistive material 7 which is used comprises a material which detects water the sensor 1 may be used to distinguish between a user actuating the sensor 1 with their finger or actuating the sensor 1 by breathing on it.

The blocks illustrated in the FIGS. 5 and 7 may represent steps in a method and/or sections of code in the computer program 51. The illustration of a particular order to the blocks does not necessarily imply that there is a required or preferred order for the blocks and the order and arrangement of the block may be varied. Furthermore, it may be possible for some blocks to be omitted.

The term "comprise" is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method comprising:
providing a first input signal to a sensor, the sensor comprising a first electrode having a shape, a resistive material surrounding and abutting the shape, and a second electrode surrounding and abutting the resistive material, at least the first and second electrodes configured to provide a variable capacitance that varies in dependence of a first parameter, and the resistive material comprising a resistive transduction mechanism so that resistivity of the resistive material varies in response to a second parameter;
measuring a first output signal, provided from the sensor in response to the first input signal, and calculating capacitance of the sensor from the first measured output signal to sense the first parameter;
providing a second input signal to the sensor, the second input signal different from the first input signal;
measuring a second output signal, provided from the sensor in response to the second input signal, and calculating resistance of the sensor from the second output signal to sense the second parameter;
wherein the first and second input signals are provided to the sensor at different times.

2. A method as claimed in claim 1 wherein each of the first and second input signals are provided a plurality of times.

3. A method as claimed in claim 1 wherein the first and second input signals are provided alternately.

4. A method as claimed in claim 1 wherein the first input signal comprises a first pulse sequence and the second input signal comprises a second, different pulse sequence.

5. A method as claimed in claim 1 wherein the first input signal causes a capacitor within the sensor to be repeatedly charged and discharged.

6. A method as claimed in claim 1 wherein the second input signal causes a measurement capacitor to be charged and then discharged through the sensor.

7. A method as claimed in claim 1 further comprising storing the calculated capacitance and resistance.

8. A method as claimed in claim 1 wherein the first sensed parameter comprises a conductive object in proximity to the sensor, wherein the second sensed parameter comprises an environmental parameter.

9. The method of claim 1, further comprising using the sensed first and second parameters to detect a user input.

10. The method of claim 1, further comprising using the sensed first parameter to determine a conductive object is in proximity to the sensor.

11. The method of claim 1, further comprising using the sensed first parameter to determine proximity and location of a conductive object in relation to the sensor.

12. The method of claim 1, further comprising using the sensed second parameter to determine presence of an environmental parameter.

13. An apparatus comprising:
processing circuitry; and
memory circuitry including computer program code;
the memory circuitry and the computer program code configured to, with the processing circuitry, cause the apparatus at least to perform:
providing a first input signal to a sensor, the sensor comprising a first electrode having a shape, a resistive material surrounding and abutting the shape, and a second electrode surrounding and abutting the resistive material, at least the first and second electrodes configured to provide a variable capacitance that varies in dependence of a first parameter, and the resistive material comprising a resistive transduction mechanism so that resistivity of the resistive material varies in response to a second parameter;
measuring a first output signal, provided from the sensor in response to the first input signal, and calculating capacitance of the sensor from the first measured output signal to sense the first parameter;
providing a second input signal to the sensor, the second input signal different from the first input signal;
measuring a second output signal, provided from the sensor in response to the second input signal, and calculating resistance of the sensor from the second output signal to sense the second parameter;
wherein the first and second input signals are provided to the sensor at different times.

14. An apparatus as claimed in claim 13 wherein the memory circuitry and the computer program code are configured to, with the processing circuitry, cause the first and second input signals to each be provided a plurality of times.

15. An apparatus as claimed in claim 13 wherein the memory circuitry and the computer program code are configured to, with the processing circuitry, cause the first and second input signals to be provided alternately.

16. An apparatus as claimed in claim 13 wherein the first input signal comprises a first pulse sequence, and the second input signal comprises a second, different pulse sequence.

17. An apparatus as claimed in claim 13 wherein the first input signal causes a capacitor within the sensor to be repeatedly charged and discharged.

18. An apparatus as claimed in claim 13 wherein the second input signal causes a measurement capacitor to be charged and then discharged through the sensor.

19. An apparatus as claimed in claim 13 wherein the first sensed parameter comprises a conductive object in proximity to the sensor, and wherein the second sensed parameter comprises an environmental parameter.

* * * * *